(12) United States Patent
He et al.

(10) Patent No.: US 7,659,775 B2
(45) Date of Patent: Feb. 9, 2010

(54) OUTPUT DIFFERENTIAL STAGE

(75) Inventors: Qiurong He, Woburn, MA (US);
Geoffrey T. Haigh, Boxford, MA (US)

(73) Assignee: Analog Devices, Inc., Norwood, MA (US)

( * ) Notice: Subject to any disclaimer, the term of this patent is extended or adjusted under 35 U.S.C. 154(b) by 25 days.

(21) Appl. No.: 11/861,364

(22) Filed: Sep. 26, 2007

(65) Prior Publication Data
US 2008/0074188 A1 Mar. 27, 2008

Related U.S. Application Data

(60) Provisional application No. 60/826,974, filed on Sep. 26, 2006, provisional application No. 60/826,978, filed on Sep. 26, 2006.

(51) Int. Cl.
*G06G 7/12* (2006.01)

(52) U.S. Cl. .................... 327/563; 327/108; 327/333

(58) Field of Classification Search .............. 327/108, 327/318, 319, 333, 561, 562, 563
See application file for complete search history.

(56) References Cited

U.S. PATENT DOCUMENTS

| 6,424,210 | B1 * | 7/2002 | Iigai et al. | 327/563 |
| 7,135,894 | B1 * | 11/2006 | Stegers et al. | 327/108 |
| 7,400,168 | B2 * | 7/2008 | Katou | 326/68 |
| 7,495,477 | B2 * | 2/2009 | Cho et al. | 326/115 |

\* cited by examiner

*Primary Examiner*—Jeffrey S Zweizig
(74) *Attorney, Agent, or Firm*—Sunstein Kann Murphy & Timbers LLP

(57) ABSTRACT

A bipolar differential output circuit includes an input differential bipolar stage for receiving an input signal and generating a differential output current. An output differential pair of bipolar transistors without a bipolar tail current source responds to the input signal by providing a representative output signal. And a current mirror circuit passes current from the input differential pair to the output differential pair.

5 Claims, 5 Drawing Sheets

OUTPUT DIFFERENTIAL STAGE

This application claims priority from U.S. Provisional Application 60/826,974, filed Sep. 26, 2006, and from U.S. Provisional Application 60/826,978, filed Sep. 26, 2006, which are hereby incorporated by reference.

FIELD OF THE INVENTION

The present invention relates to differential output stages, and more specifically output stages that can comply with LVDS (low voltage differential signaling) requirements or a differential multiplexer output stage.

BACKGROUND ART

Low Voltage Differential Switching (LVDS) is a known ANSI standard. In the prior art, LVDS output stages have been implemented in CMOS, bipolar, and BiCMOS processes. However, as the power supply voltage levels decrease from 3.3V to 2.5V, bipolar implementations become more difficult.

FIG. 1 shows a typical example of a prior art LVDS bipolar output stage. The input differential transistor pair Q101-Q102 are bipolar PNP transistors. The tail current for this differential transistor pair comes from a bipolar transistor Q103 and the amount of the tail current is controlled by a current mirror Q104. The LVDS standards require the outputs have offset voltage level from 1.125V to 1.275V with 250 mV to 400 mV swing. Also, the power supply voltage level needs to be high enough to avoid saturating the transistors in the differential pair Q101-Q102, and the current source Q103. For many processes, it is nearly impossible to use 2.5V power supply voltage in this implementation. And since PNP bipolar transistors are used, the circuit operates at a less than optimal speed for data and RF applications.

FIG. 2 shows another form of output circuit known in the art, a differential multiplexer. In this configuration, the input differential pair Q202-Q202b or Q203-Q203b, and the selection differential pair Q201-Q201b are stacked together. A sufficiently high power supply voltage is needed in such a configuration to avoid device saturation and is difficult to implement with a 2.5V power supply voltage. Another disadvantage of this configuration is that the select signal S-Sb can couple to the output through junction capacitance of the selection differential pair Q201-Q201b thereby producing an output signal that is corrupted for some time following the select transitions.

SUMMARY OF THE INVENTION

A bipolar differential output circuit includes an input differential bipolar stage for receiving an input signal and generating a differential output current. An output differential pair of bipolar transistors without a bipolar tail current source responds to the input signal by providing a representative output signal. And a current mirror circuit passes current from the input differential stage to the output differential pair.

In further specific embodiments, the output differential pair of bipolar transistors may be PNP or NPN transistors. If NPN transistors are used, the output signal may comply with the Low Voltage Differential Signaling (LVDS) ANSI standard. The current mirror circuit may maintain a keep-alive current to stay ON during operation, which maintains a trickle current flow in an OFF transistor in the output differential pair. Also, the current mirror circuit may include a pair of inductive peaking resistors.

Embodiments also include a differential multiplexer circuit which has an input stage including multiple differential pairs of bipolar transistors, each having an associated differential input, and all sharing a common output circuit. A differential select stage receives an input select signal and generates a differential output current. And current mirror circuits pass currents from the select stage to the tails of the differential pairs of the input stage.

In further specific such embodiments, the input differential pairs of bipolar transistors may be PNP or NPN transistors. The current mirror circuits may include a pair of inductive peaking resistors. The current mirror circuits may maintains a keep-alive current to stay ON during operation.

DETAILED DESCRIPTION OF SPECIFIC EMBODIMENTS

Figure 3:
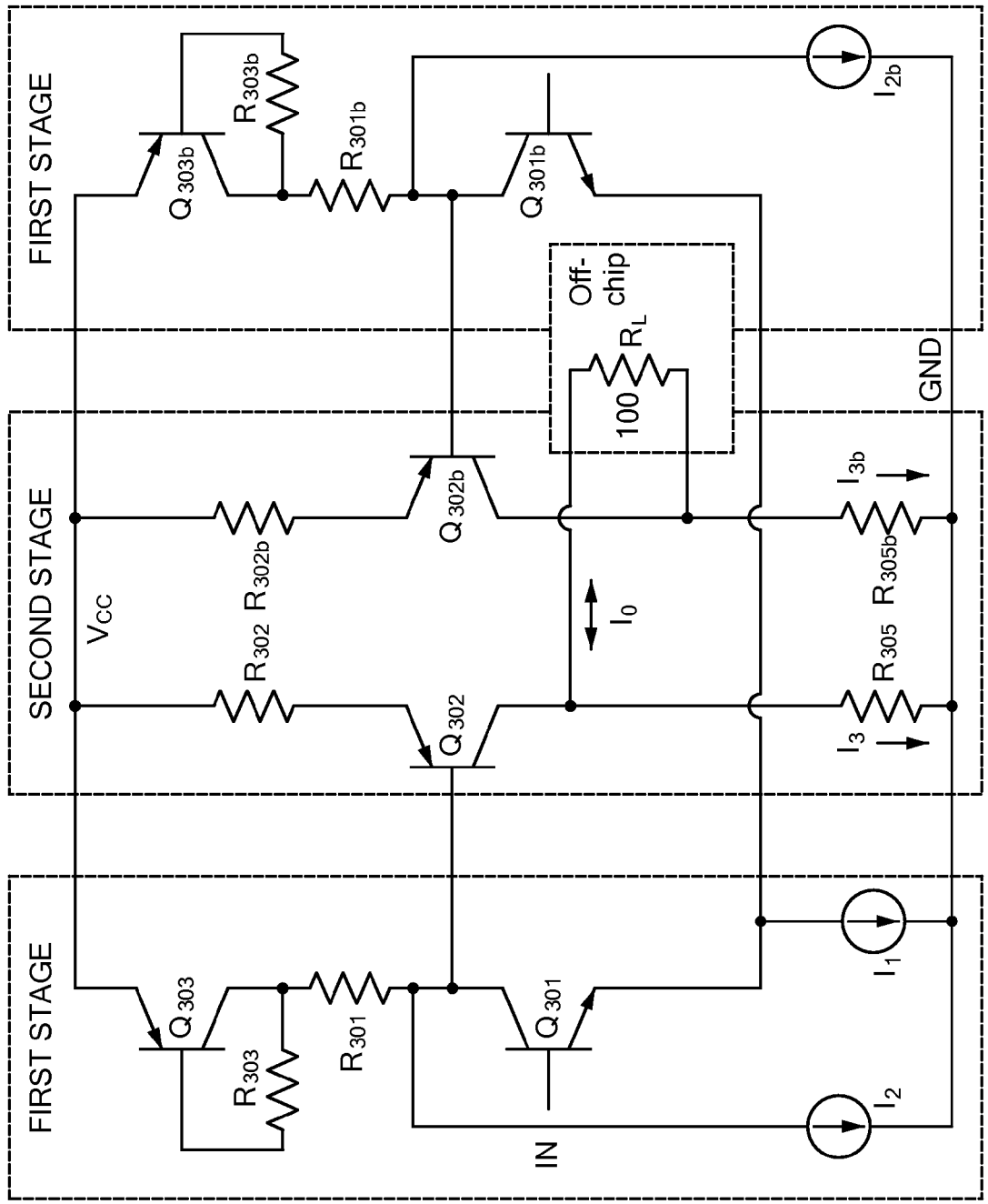
FIG. 3 is a first embodiment of a differential bipolar output stage.

FIG. 3 shows a first embodiment of a bipolar differential output circuit that is LVDS compliant. This bipolar output circuit can be thought of as having two stages, with the first input stage being a differential bipolar pair Q301-Q301b that receives the differential input signal at the base of each of the bipolar transistors. The second output stage provides the output current to LVDS compliant 100-ohm resistive load with a differential pair of bipolar PNP transistors Q302-Q302b. Current from the first input stage is passed to the second output stage via a current mirror that includes the pairs of Q303-Q303b and Q302-Q302b and emitter degeneration resistors R301-R301b and R302-R302b. The ratio of the current mirror is determined by the device sizes of Q302-Q302b and Q303-Q303b, as well as the resistances of R301-R301b and R302-R302b. Thus, the differential input signal generates a differential current that passes through resistors R302-R302b. Because there is no bipolar tail current source for the second stage as is done in the prior art, the minimum power supply voltage required in this circuit is less than that in the prior art by one $V_{CE}$ voltage drop.

By choosing the appropriate value of resistors R305-R305b, the output voltage level and swing across the load can be compliant with the LVDS standards. The differential pair of Q301-Q301b will be fully switched in operation so that the collector signals are stable. The current sources $I_2$ and $I_{2b}$ have the same current values to keep the current mirror of Q303-Q303b and Q302-Q302b alive. This helps maintain the high-speed transition of the current mirrors no matter how much current in the input differential transistor Q301-Q301b or output differential transistor Q302-Q302b. PNP devices are generally slower than NPN devices, so the PNP transistors in the second differential pair often limit the overall circuit speed. Using the keep-alive current sources $I_2$ and $I_{2b}$ also maintains current flow in PNP transistor pair Q302-Q302b, which helps increase the transition speed in these PNP devices. The operational speed of the circuit is also helped by the inductive peaking resistors R303-R303b.

Figure 4:
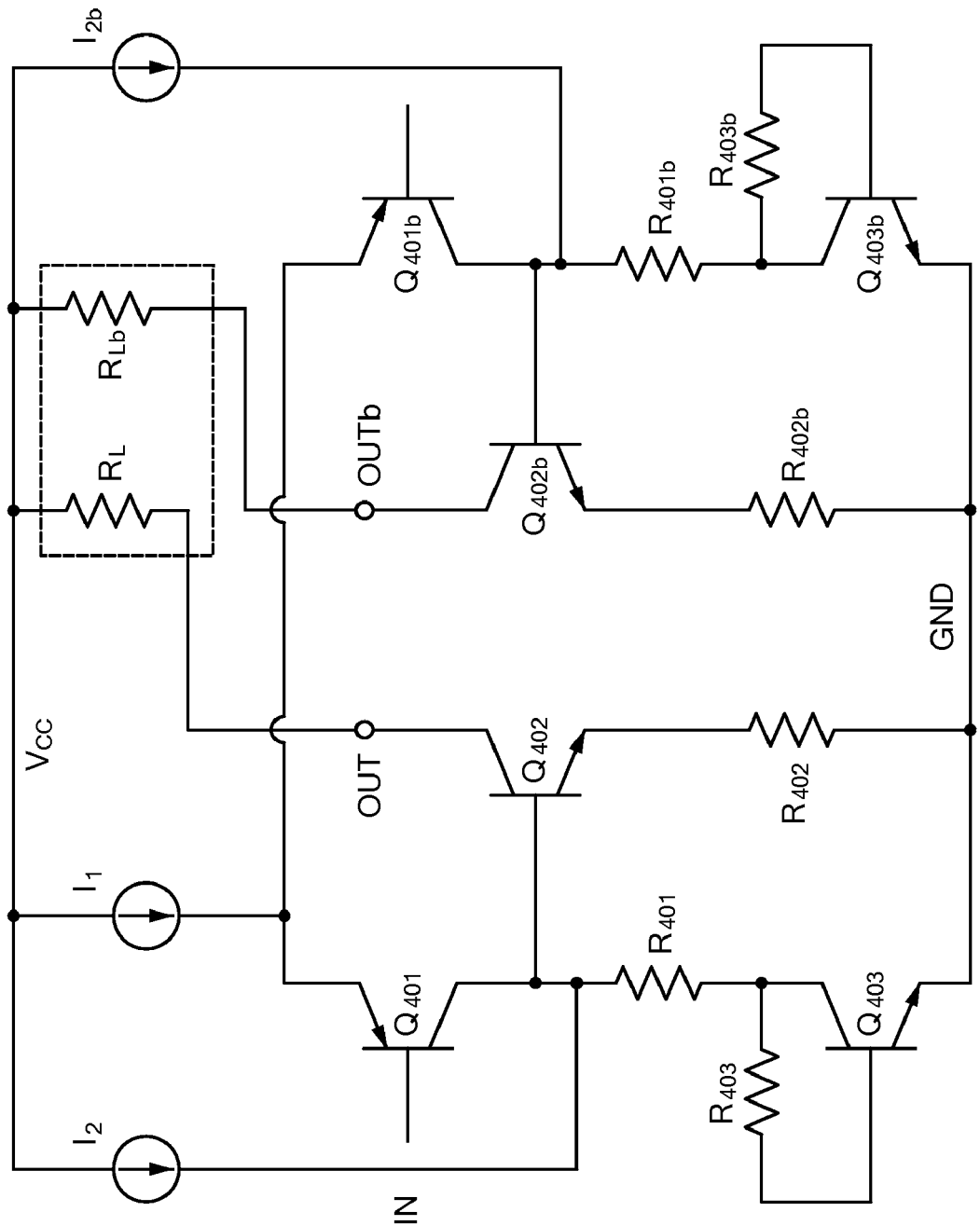
FIG. 4 is a second embodiment of a differential bipolar output stage.

An alternate topology with similar circuit performance can be created by swapping R301-R301b with Q303-Q303b (along with optional R303-R303b). FIG. 4 shows another alternative embodiment with opposite PN/NP polarity from FIG. 3, which can be used in applications requiring a large voltage output swing.

Figure 1:
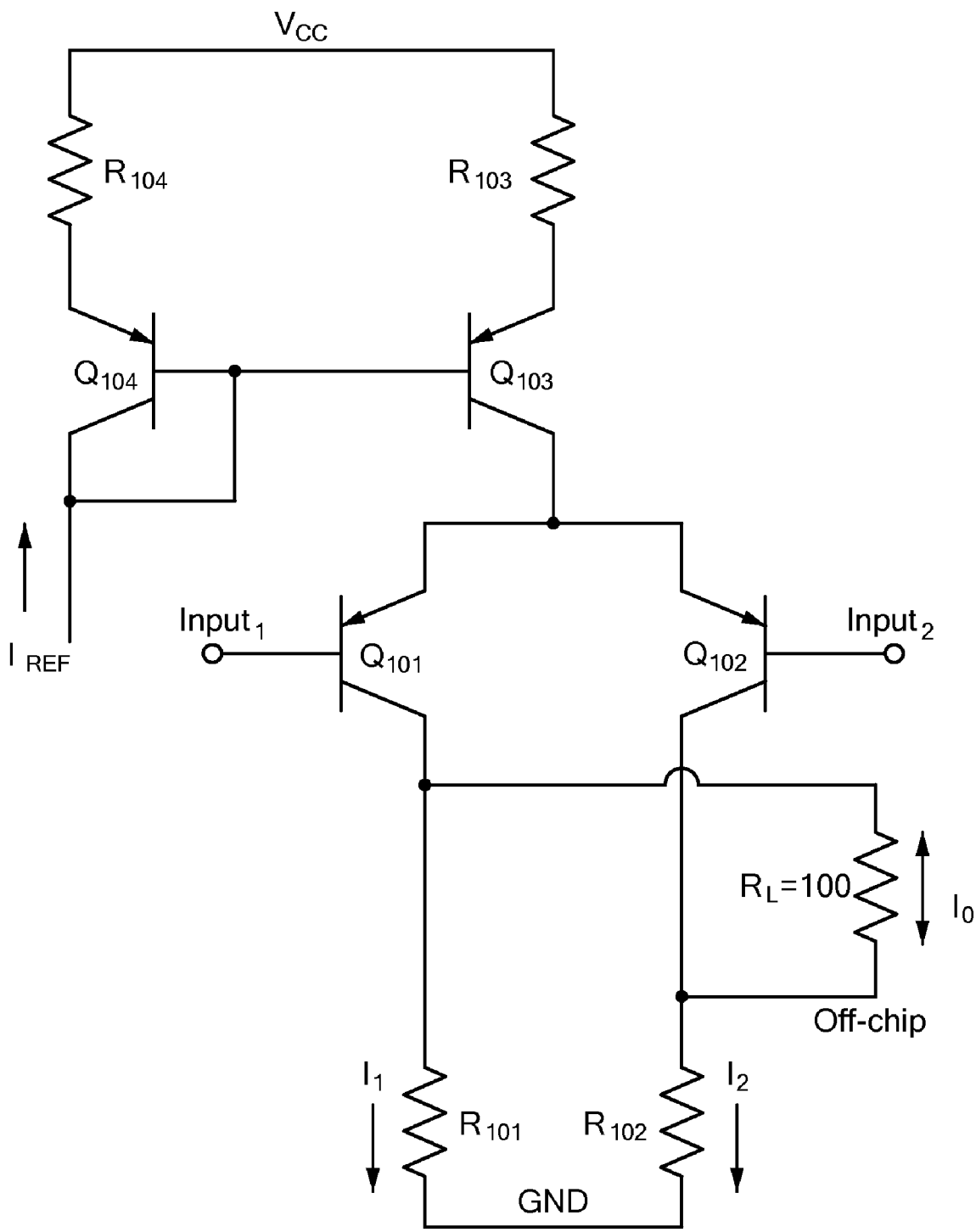
FIG. 1 is a prior art differential bipolar output stage.
Figure 2:
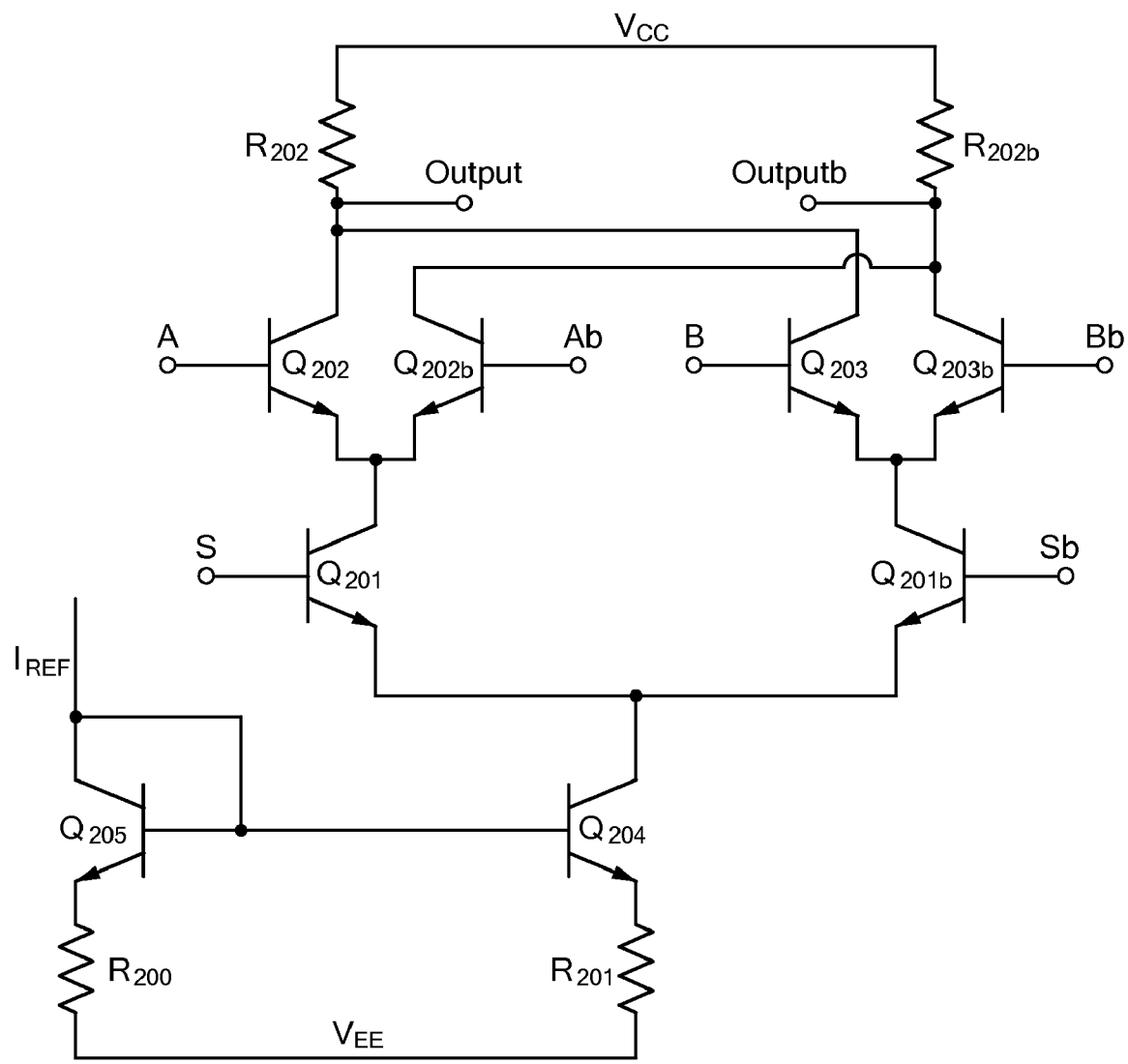
FIG. 2 is a prior art differential multiplexer stage.

Embodiments of the invention also include an output stage circuit in the specific form of a differential multiplexer which splits the select stage and the input stage. To improve the isolation between the select signal and the outputs, a current mirror stage is inserted between the select and input stages to pass the differential current signals from the select stage to the input stage. Such embodiments maintain high-speed selection due to the fast transition provided by the current mirrors. In some specific embodiments, there may be two differential current mirrors in the input differential pair which share the emitter degeneration resistor. Thus, one of these current mirrors will be turned off when receiving differential currents from the current mirror stage. Such embodiments can operate at lower power supply voltages than that required by prior art circuits such as shown in FIG. 2.

Figure 5:
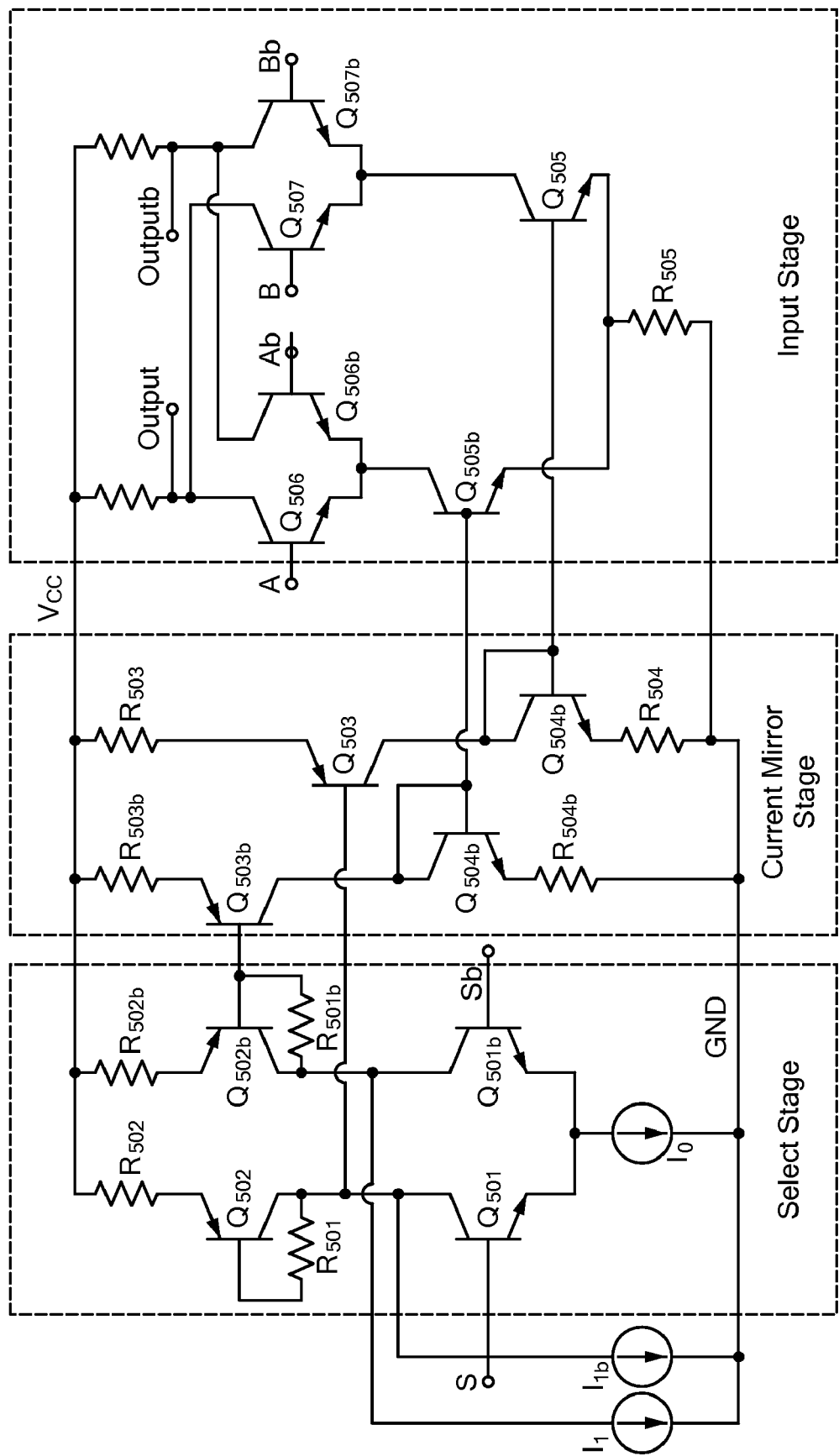
FIG. 5 is an embodiment of a differential multiplexer stage.

FIG. 5 shows one embodiment of a differential multiplexer circuit having three conceptual stages: a select stage, a current mirror stage, and an input stage. The select stage of Q501-Q501b and Q502-Q502b selects among a plurality of inputs to provide to the output. Based upon the selection signal S, $S_b$, either differential input signal A, $A_b$ or B, $B_b$ is provided to the output. It should be understood that although a two input multiplexer is shown, embodiments of the present invention include differential multiplexers of different configurations having more inputs and/or outputs.

In FIG. 5, the select stage is formed by a differential pair of bipolar NPN transistors Q501-Q501b that receive the differential select signal S and its complement $S_b$. In addition to the standard tail current source $I_0$ for the differential transistor pair Q501-Q501b, each bipolar transistor is combined at the collectors with a second current source $I_1$ and $I_{1b}$ which are keep-alive current sources that maintain current flowing in transistors Q502-Q502b even when the select stage Q501-Q501b is fully switched. Thus, the amount of current in Q502-Q502b is well controlled and less sensitive to the select signals S, Sb.

PNP transistor pair Q502-Q502b and Q503-Q503b form differential current mirrors that pass the currents in each branch of the select stage to the current mirror stage by a pre-determined ratio. The ratio is determined by the devices size and their emitter degeneration resistors. Optional inductive peaking resistor R501-R501b aid transition speed of the current mirror. The current mirror stage again mirrors the current at the input stage. Since the emitter degeneration resistor R505 is shared by the input stage differential pair Q505-Q505b, the current in R505 is determined by the larger current in Q504-Q504b. For example, if Q504 has more current flowing than Q504b at a particular time, the voltage drop across R504b will be less than that across R505. Therefore, the $V_{BE}$ of Q505b is less than that of Q504b. By choosing the appropriate values of $I_0$ and R505, Q505b can be completely turned off. Thus, only input B is selected and passed to the output.

The coupling between the select signals S and Sb and the outputs is much less than that in the prior art such as shown in FIG. 2, since it has an additional current mirror stage in between the select and input stages. The FIG. 5 circuit also requires less power supply voltage because in the critical input stage, it only requires $2V_{BE}$, plus the output swing and voltage across R505. This is about one $V_{CE}$ less than that in FIG. 2, which gives more flexibility to bias the input stage to assure optimal AC performance. The select stage and the current mirror stage are now separated and less critical in determining overall circuit performance. The select stage requires the most power supply voltage in the circuit, but it can still use less power supply than the prior art in FIG. 2. First, R502 and R502b are now simply emitter degeneration resistors so the required voltage across them is less than the output swing (which goes across R502 and R502b) in FIG. 2. Second, since the select stage is not the critical stage, device size of transistors Q502-Q502b and Q501-Q501b can be bigger and their respective biasing currents can be lower, both of which can reduce the device $V_{BE}$ value and save head room.

Although various exemplary embodiments of the invention have been disclosed, it should be apparent to those skilled in the art that various changes and modifications can be made which will achieve some of the advantages of the invention without departing from the true scope of the invention. Also, the figures of exemplary embodiments show the use of bipolar devices, but embodiments can also be applied to other processes such as MOSFET, CMOS, or BiCOMS.

What is claimed is:

1. A differential bipolar output circuit comprising:
   an input differential bipolar stage for receiving an input signal and generating a differential output current;
   an output differential pair of bipolar transistors without a bipolar tail current source for responding to the input signal by providing a representative output signal; and
   a current mirror circuit for passing current from the input differential bipolar stage to the output differential pair; wherein each transistor in the output differential pair maintains a keep-alive trickle current flow in an OFF state which aids transition speed of the current mirror circuit.

2. A circuit according to claim 1, wherein the output signal complies with the Low Voltage Differential Signaling (LVDS) ANSI standard.

3. A circuit according to claim 1, wherein the output differential pair of bipolar transistors are PNP transistors.

4. A circuit according to claim 1, wherein the output differential pair of bipolar transistors are NPN transistors.

5. A circuit according to claim 1, wherein the current mirror circuit includes a pair of inductive peaking resistors.

* * * * *